United States Patent
Lin

(10) Patent No.: US 6,724,254 B2
(45) Date of Patent: Apr. 20, 2004

(54) AUDIO AMPLIFIER WITH OUTPUT POWER LIMITER

(75) Inventor: Jun Hui Lin, GuangZhou (CN)

(73) Assignee: Thomson Licensing, S.A., Boulogne-Billancourt (FR)

( * ) Notice: Subject to any disclaimer, the term of this patent is extended or adjusted under 35 U.S.C. 154(b) by 0 days.

(21) Appl. No.: 10/139,083

(22) Filed: May 3, 2002

(65) Prior Publication Data

US 2002/0180525 A1 Dec. 5, 2002

(30) Foreign Application Priority Data

May 31, 2001 (EP) .......................................... 01401414

(51) Int. Cl.[7] .............................................. H03F 1/52
(52) U.S. Cl. .................................. 330/207 P; 330/298
(58) Field of Search ............................ 330/207 P, 298, 330/144, 284; 327/318; 281/120

(56) References Cited

U.S. PATENT DOCUMENTS

| | | | |
|---|---|---|---|
| 3,967,207 A | 6/1976 | Wheatley, Jr. ............... | 330/309 |
| 4,023,111 A | 5/1977 | Mortensen ................... | 330/283 |
| 5,361,008 A | * 11/1994 | Saijo ........................... | 327/427 |
| 5,923,217 A | * 7/1999 | Durec ......................... | 330/288 |
| 5,969,574 A | * 10/1999 | Legates ....................... | 330/288 |
| 6,047,168 A | * 4/2000 | Carlsson et al. ............. | 455/126 |

OTHER PUBLICATIONS

Patent Abstracts of Japan, vol. 009, No. 212, Aug. 29, 1985, JP 60074707.
Search Report for EPO Patent Application No. 01401414.6–2215.

* cited by examiner

*Primary Examiner*—Robert Pascal
*Assistant Examiner*—Khanh Van Nguyen
(74) *Attorney, Agent, or Firm*—Joseph S. Tripoli; Joseph J. Laks; Reitsing Lin

(57) ABSTRACT

The amplifier comprises a power suppl, a current sensing element for sensing a current in the current path of the power supply, a detecting circuit responsive to the current sensing element, and voltage reducing means for reducing the signal amplitude of at least one of the audio signals in response to the detection circuit. The detecting circuit comprises in a preferred embodiment a threshold circuit, and when the current in the current path of the power supply is above a predefined threshold, the detection circuit together with the voltage reducing means reduce at least the signal amplitude of one of the audio channels. The current sensing element is for example a current sensing resistor and the detecting circuit is a voltage detection circuit in parallel to this resistor. The voltage reducing means comprise advantageously two diodes for each channel, via which a positive and a negative voltage limit is applied to the signal path of the audio signals.

14 Claims, 3 Drawing Sheets

AUDIO AMPLIFIER WITH OUTPUT POWER LIMITER

BACKGROUND

The present invention relates to an amplifier with a power supply for amplifying several audio signals in parallel, as known for example from integrated stereo amplifiers or surround sound amplifiers. High quality audio amplifiers have usually an output power of about 100 Watts or more per channel, for driving respective loudspeakers. In case of an surround sound amplifier, which is known for example as Dolby-Digital amplifier or Home-Cinema receiver, the amplifier has six or more separate audio channels in parallel, and therefore the power supply of the amplifier has to handle a very high total power and special means have to be provided for the amplifier to avoid over-current conditions and over-temperature conditions. Current standards, which a surround sound amplifier at present performs, are for example Dolby Pro-Logic, Dolby Digital AC-3 and DTS, with 5.1 multi-channel decoding.

He is an object of the present invention is therefore, to provide an amplifier for amplifying at least one audio signal, which comprises protection means for avoiding an overload condition, especially with regard to the output stages.

SUMMARY OF THE INVENTION

The amplifier according to the invention, for example a surround sound amplifier, comprises a power supply, a current sensing element for sensing a current in the current path of the power supply, a detecting circuit responsive to the current sensing element, and voltage reducing means for reducing the signal amplitude of at least one of the audio signals in response to the detection circuit.

The detection circuit comprises in a preferred embodiment a threshold circuit, and when the current in the current path of the power supply is above a predefined threshold, the detection circuit together with the voltage reducing means reduce at least one of the audio channels. This threshold is adjusted such, that the current drawn from the power supply is below an overload condition of the power supply.

The current sensing element is for example a current sensing resistor and the detecting circuit is a voltage detection circuit in parallel to this resistor. The voltage reducing means comprise advantageously two diodes for each channel, via which a positive and a negative voltage limit is applied to the signal path of the audio signals. When the current from the power supply is too high, the voltage above the current sensing resistor passes the predefined threshold, which causes the voltage reducing means to apply a positive and a negative voltage limit for the audio signals. The higher the voltage above the current sensing resistor is, the lower will be the voltage limits.

The voltage limits may be applied advantageously to the signal path of the audio signals between the preamplifiers and the output power amplifiers via the diodes. With this arrangement an existing design of a surround sound amplifier does not have to be modified.

The power limiting circuit as described has the following advantages: It provides an over-current protection for the transformer for avoiding a respective overheating of the transformer. Further, it avoids an overheating of the transistor stages in the output power amplifiers, which need therefore no temperature protection.

BRIEF DESCRIPTION OF THE DRAWINGS

The invention is explained in more detail with regard to a preferred embodiment, as shown in the schematic drawings.

DETAILED DESCRIPTION OF THE PREFERRED EMBODIMENT

Figure 1:
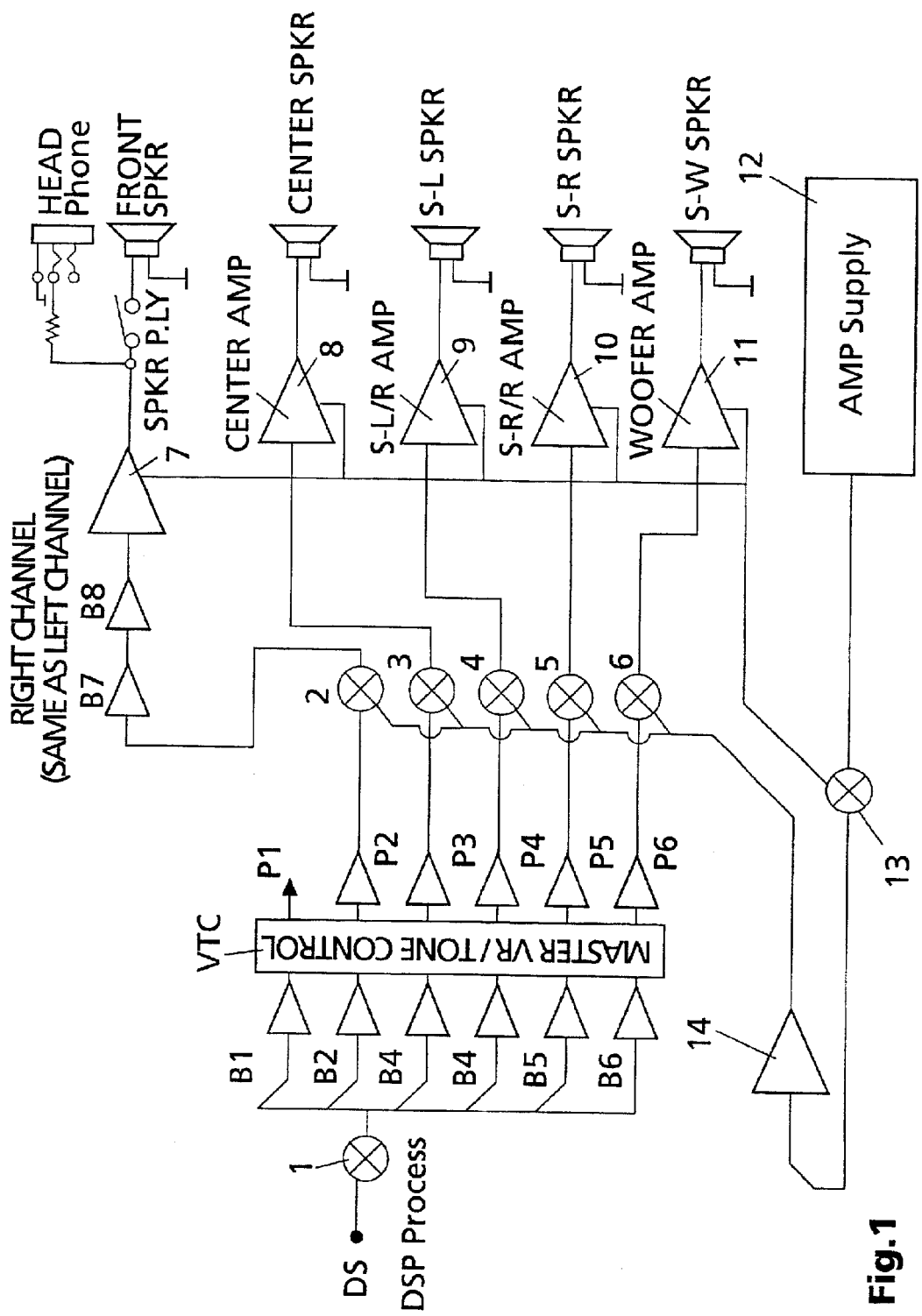
FIG. 1 a surround sound amplifier with six audio channels.

The surround sound amplifier of FIG. 1 comprises an input section (not shown), via which one of several sources of audio/video signals, for example of a DVD player, a video recorder, or a settop box is selected and subsequently applied to an input DS of a digital signal processor 1, in which the respective audio and video formats are processed, and which extracts the audio signals. The audio formats to handle in this embodiment are for example two-channel stereo, Dolby pro-Logic or Dolby Digital surround. Digital surround sounds require six channels, known as 5.1 channels, which relate in a room to loudspeakers at the front side for a left, a right and a center channel, at the back side for a left and a right channel, and an additional channel with a reduced bandwidth for a subwoofer. The signal processor 1 therefore provides six parallel audio signals, which are buffered in this embodiment by buffer amplifiers B1–B6 and processed subsequently in a volume/tone control unit VTC. In the unit VTC the master volume and the relative volumes between the audio channels are adjusted, and a tone control for the frequency response is available for a user.

After the volume/tone control unit VTC follow preamplifiers P1–P6 for voltage amplification, and subsequently power amplifiers 7–11, for providing low-impedance outputs for driving the respective loudspeakers. In FIG. 1, only the sections of the front channels for the right channel with buffer amplifiers B7, B8 and the power amplifier 7, and for the center channel with power amplifier 8 are shown, because right channel and left channel are identical. The rear amplifier channels 9 and 10 drive rear left speaker S-L and rear right speaker S-R, and the subwoofer amplifier 11 drives a respective subwoofer loudspeaker S-W.

The surround sound amplifier comprises further a power supply 12 for providing supply voltages for the amplifier channels. According to the invention the amplifier comprises a current sensing element 13 in the current path between the power supply 12 and the power amplifiers 7–11, the power amplifiers requiring the essential part of the power of the power supply. A detecting circuit 14 is responsive to the current sensing element 13, for reducing the signal amplitudes in the audio channels, when the current drawn from the power supply 12 is too high. The voltage reducing means 2–6 for reducing the signal amplitudes in the audio channels are arranged advantageously between the preamplifiers P1–P6 and the main power amplifiers 7–11 for reducing the respective signal amplitudes in case of an overload condition.

Figure 2:
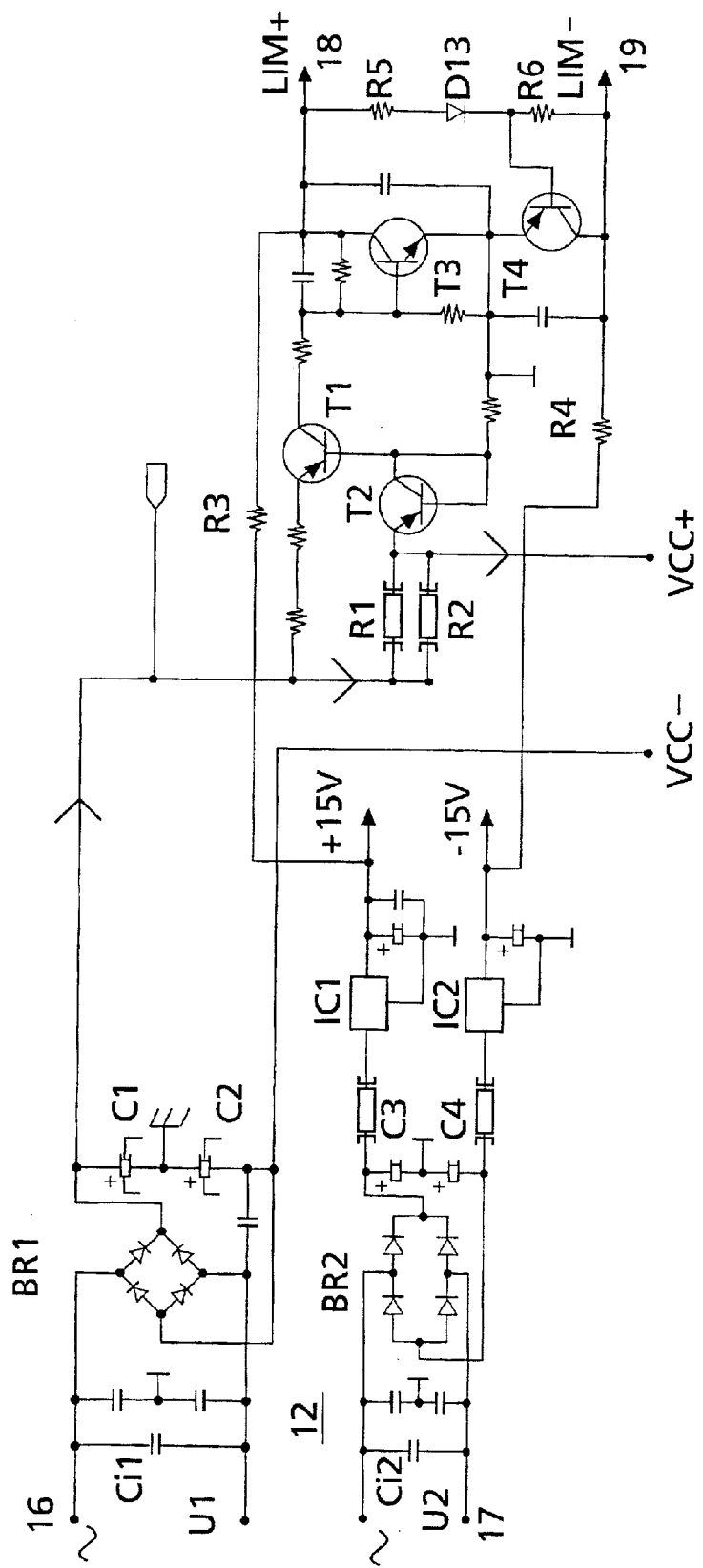
FIG. 2 a power supply and a current sensing resistor together with a voltage detection circuit, and FIG. 3 voltage reducing means for reducing the signal amplitude of six audio channels.

FIG. 2 shows a detailed arrangement of the power supply 12 for the analog part of the amplifier together with a circuit for limiting the current of the power supply. For the output power amplifiers 7–11 of FIG. 1 a separate power supply is provided with input terminals 16, to which an alternating voltage U1 from a transformer (not shown) is applied, the transformer being coupled to the mains voltage, for example 230 Volts/50 Hz. This alternating voltage is rectified in a rectifier circuit BR1 and smoothed in electrolyte capacitors C1, C2, which provide the supply voltages VCC+ and VCC−, for example +/−50 Volts, for the power amplifiers of the surround sound amplifier. In front of the rectifier circuit BR1 smaller capacitors Ci1 are arranged for noise voltage suppression.

The power supply for the preamplifiers is arranged correspondingly with an input terminal 17, to which an alternating voltage U2 from the transformer is applied, input capacitors Ci2 and a rectifier circuit BR2. The output voltages of the rectifier circuit BR2 are smoothed by capacitors C3, C4 and further stabilized by integrated circuits IC1, IC2, to provide stable supply voltages of +/−15 Volts. The power supplies for the power amplifiers as well as for the preamplifiers are symmetric with respect to ground.

In the current path of the positive supply voltage between the power supply for the power amplifiers and the power amplifiers, behind capacitor Cl, a current sensing element with two resistors R1, R2 in parallel is arranged for detecting the current provided by the power supply. Because the current in the negative supply voltage VCC− corresponds to the current of the positive supply voltage VCC+, only one current sensing element is necessary.

In parallel to the resistors R1, R2 a voltage detection circuit is arranged, comprising two transistors T1, T2. The transistor T2, which is coupled with its emitter to the current path behind the resistors R1, R2, provides a reference voltage for the base of the transistor T1, which corresponds to voltage VCC+. The emitter of the transistor T1 is coupled to the current path in front of the resistors R1, R2. Therefore, when the current through resistors R1, R2 is low, the voltage drop above these resistors is negligible, and therefore transistor T1 closed.

In case the current through resistors R1, R2 rises, the voltage above these resistors rises also, and therefore also between emitter terminal and base terminal of the transistor T1. The transistor T1 is then conducting and provides therefore via its collector a voltage information for reducing the signal amplitudes of the audio channels.

The supply voltages +/−15 Volts are applied to outputs terminals 18 and 19 via resistor R3, respectively R4. In response to the transistor T1 transistors T3 and T4 are arranged. When the transistor T1 is closed, the voltage at the base of transistor T3 is essentially ground and transistor T3 is therefore also closed. The output voltage LIM+ at output terminal 18 is therefore high, +15 V. When the transistor T1 is conducting, the transistor T3 goes also in conducting mode and reduces therefore the voltage LIM+, because transistor T3 then generates a voltage drop above resistor R3.

The base of transistor T4 is coupled via resistor R5 and diode D13 to the output terminal 18, and via resistor R6 to output terminal 19. The emitter of transistor T4 is coupled to ground and the collector to output terminal 19. The resistors R5, R6 provide a voltage divider for the base of transistor T4 and are adjusted such, that the transistor T4 is just closed when the voltage LIM+ is high, for example, the voltage at the base of transistor T4 is at ground potential. When the voltage LIM+ drops, the voltage at the base of transistor C4 becomes negative, which opens the transistor T4 correspondingly to transistor T3, and therefore providing also a reduced voltage LIM−.

The transistor stages T1, T2 may be arranged via resistors such, that a predefined threshold is provided, below which transistor T1 is not conducting. Only in case of a voltage too high above the resistors R1, R2, the limiter circuit becomes active. For example, the amplifier has 6 audio channels, and the specification requires an amplifier power of 100 W for all 6 channels. Because the supply voltages VCC+, VCC− are symmetric to ground and provide each the same power, the power requirement for the positive supply channel VCC+ is 6×50 W=300 W. The corresponding current, when the supply voltage VCC+ for example is 50 V, is 6 A. The resistors R1, R2 and the transistor stages T1, T2 may be arranged therefore such, that the current limiter becomes active at a threshold with a current of 6.5 A flowing through resistors R1 and R2.

Figure 3:
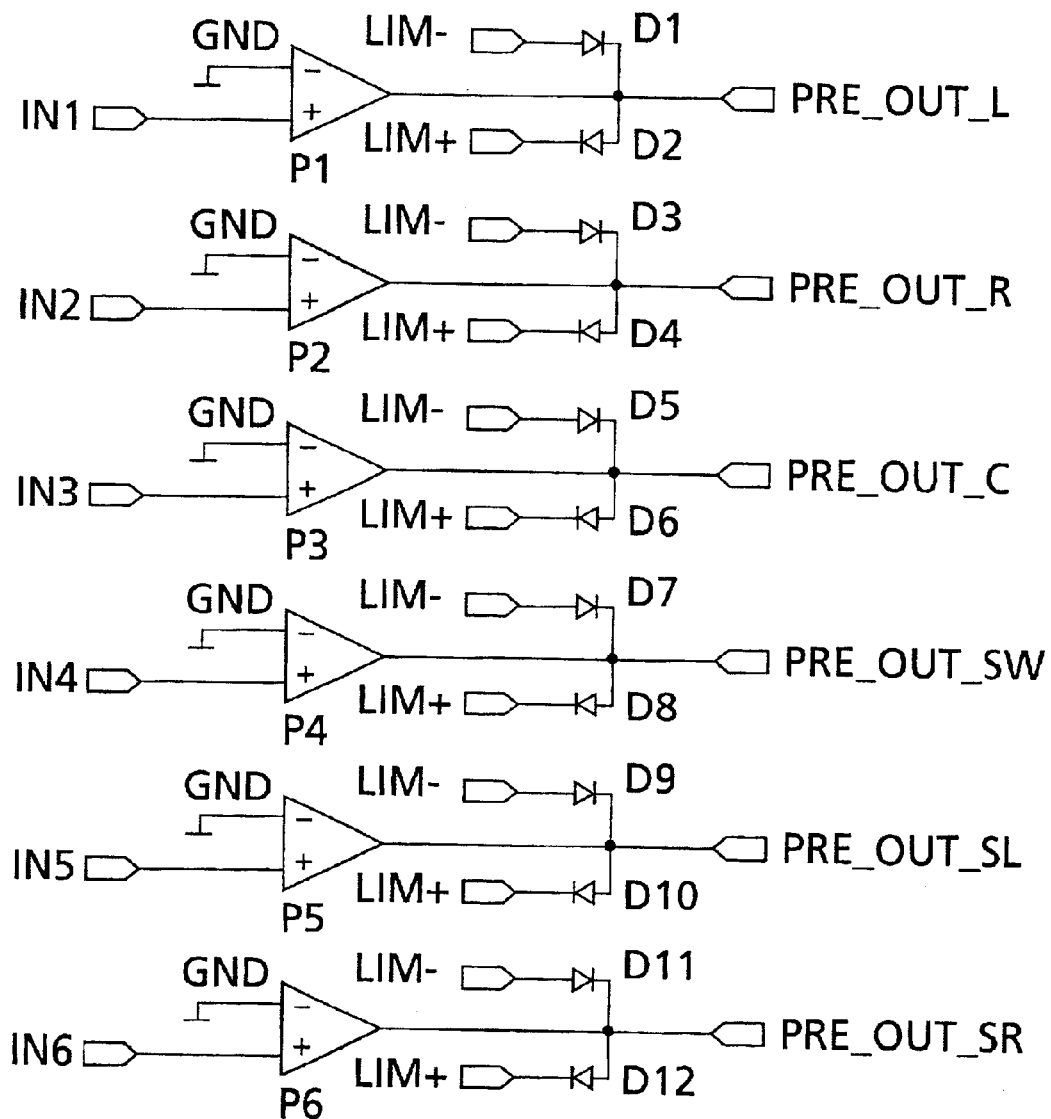

The voltages LIM+ and LIM− are used for reducing the signal amplitudes of the audio channels, which have to be amplified, as will be explained with regard to FIG. 3. In FIG. 3 the preamplifiers P1–P6, see FIG. 1, are shown having respective inputs IN1–IN6 for a pre-amplification of the six audio channels. Behind the preamplifiers P1–P6 for each channel a limiting circuit is applied, in front of the respective power amplifiers 7–11. To each audio channel the voltage LIM+ and LIM− is applied via a respective diode D1–D12, and the polarity of the diodes D1–D12 is such, that the output voltage of each of the preamplifiers P1–P6 is clipped, respectively limited, when the output voltage is above LIM+ or below LIM−. In case the output current of the power supply for the power amplifiers is too high, via the voltages LIM+ and LIM− the input voltages of the power amplifiers 7–11 are correspondingly reduced, avoiding therefore any overload condition for the surround sound amplifier.

The current limiter as shown in FIGS. 2 and 3 requires therefore only a few and cheap circuit parts for providing effective overload protection, without the need to modify the amplifier sections. Other embodiments of the invention are also possible and obvious for a person skilled in the art. For example, the output voltages of the preamplifiers may be reduced via transistors being coupled to the respective outputs of the preamplifiers P1–P6, or voltage controlled resistors instead of diodes may be used. Also, instead of using a current sensing resistor, a coil or other means may be used for measuring the current in a current path of the power supply. The current limiting circuit may be effective above a certain threshold or independent of any threshold, for working continuously, dependant on the voltage above the current sensing resistor. The voltage limits LIM+, LIM− are advantageously applied to all audio channels, but application to only one or a few audio channels, for example the ones which have usually the highest output power, is also possible.

What is claimed is:

1. Amplifier with a power supply for amplifying several audio signals, said amplifier comprising:

a current sensing element for sensing a current in a current path of said power supply, a detecting circuit responsive to said current sensing element, and voltage reducing means for reducing a signal amplitude of at least one of said audio signals, wherein said detecting circuit comprising a threshold detection circuit for reducing at least the amplitude of one of said audio signals via said voltage reducing means in response to said detecting circuit, when the current in said current path is above a predefined threshold.

2. Amplifier with a power supply for amplifying several audio signals, said amplifier comprising:

a current sensing element for sensing a current in a current path of said power supply, a detecting circuit responsive to said current sensing element, and voltage reducing means for reducing the signal amplitude of at least one of said audio signals in response to said detecting circuit, wherein said voltage reducing means are arranged each between a preamplifier and a power amplifier.

3. Amplifier with a power supply for amplifying several audio signals, said amplifier comprising:
- a current sensing element for sensing a current in a current path of said power supply,
- a detecting circuit responsive to said current sensing element, and
- voltage reducing means for reducing the signal amplitude of at least one of said audio signals in response to said detecting circuit, wherein a positive and a negative voltage limit is applied to the signal path of said audio signals by said voltage reducing means, said voltage reducing means comprise resistors and diodes via which a positive and a negative supply voltage for said preamplifiers are coupled to said signal path, and said detection circuit is arranged such that in case the current in the current path of the power supply is above a predefined threshold, said supply voltages applied to said signal path are reduced in correspondence to the current in said current path.

4. Amplifier with a power supply for amplifying several audio signals, said amplifier comprising:
- a current sensing element for sensing a current in a current path of said power supply,
- a detecting circuit responsive to said current sensing element, and
- voltage reducing means for reducing the signal amplitude of at least one of said audio signals in response to said detecting circuit, wherein said current sensing element is a resistor for sensing the current in the current path of said power supply, and said detecting circuit is a voltage detection circuit in parallel to said resistor.

5. Amplifier according to claim 4, wherein said voltage detection circuit comprises a first transistor stage for providing a threshold in response to the voltage above said resistor, and a second transistor stage for a symmetric reduction of the voltage limit applied to a signal path of said audio signals, when the voltage above said resistor is above said threshold.

6. Amplifier with a power supply for amplifying several audio signals, said amplifier comprising:
- a current sensing element for sensing a current in a current path of said power supply,
- a detecting circuit responsive to said current sensing element, and
- voltage reducing means for reducing the signal amplitude of at least one of said audio signals in response to said detecting circuit, wherein said power supply comprises a supply voltage generation circuit for power amplifiers, and that said resistor is a current detecting resistor coupled between said supply voltage generation circuit and supply voltage inputs of said power amplifiers.

7. Amplifier with a power supply for amplifying several audio signals, said amplifier comprising:
- a current sensing element for sensing a current in a current path of said power supply,
- a detecting circuit responsive to said current sensing element, and
- voltage reducing means for reducing the signal amplitude of at least one of said audio signals in response to said detecting circuit, wherein the amplifier is a surround sound amplifier with several audio channels in parallel.

8. Audio amplifier with a power supply for amplifying an audio signal, said amplifier comprising:
- a current sensing element for sensing a current in a current path of the power supply,
- a detecting circuit responsive to said current sensing element,
- a preamplifier and a power amplifier coupled to said preamplifier, and
- signal reducing means arranged between said preamplifier and said power amplifier for reducing the signal amplitude of said audio signal in response to said detecting circuit.

9. Audio appliance amplifying several audio signals, comprising:
- a preamplifier and a power amplifier,
- a power supply,
- a current sensing element for sensing a current in a current path of said power supply,
- a detecting circuit responsive to said current sensing element, and
- voltage reducing means for reducing the signal amplitude of at least one of said audio signals in response to said detecting circuit, said voltage reducing means being arranged between said preamplifier and said power amplifier.

10. Audio appliance according to claim 9, wherein said detection circuit comprises a threshold detection circuit for reducing at least the amplitude of one of said audio signals, when the current in the current path of said power supply is above a predefined threshold.

11. Audio appliance according to claim 10, wherein a positive and a negative voltage limit is applied to the signal path of said audio signals, particularly via diodes of said voltage reducing means.

12. Audio appliance according to claim 11, wherein the positive and the negative supply voltage for the preamplifiers are coupled via resistors and said diodes to said signal path, and in case the current in the current path of the power supply is above a predefined threshold, the voltages applied to said signal path are reduced in correspondence to the current in said current path.

13. Audio appliance according to claim 9, wherein said current sensing element is a resistor for sensing the current in the current path of the power supply, and that said detecting circuit is a voltage detection circuit in parallel to said resistor.

14. Audio appliance according to claim 9, wherein said appliance is a surround sound amplifier with several audio channels in parallel.

* * * * *